US012772572B2

(12) United States Patent
He et al.

(10) Patent No.: US 12,772,572 B2
(45) Date of Patent: Oct. 20, 2026

(54) SEMICONDUCTOR DEVICE STRUCTURES AND METHODS OF MANUFACTURING THE SAME

(71) Applicant: INNOSCIENCE (SUZHOU) SEMICONDUCTOR CO., LTD., Jiangsu (CN)

(72) Inventors: Yi He, Guangdong (CN); Jheng-Sheng You, Guangdong (CN); Weixing Du, Guangdong (CN)

(73) Assignee: INNOSCIENCE (SUZHOU) SEMICONDUCTOR CO., LTTD., Jiangsu (CN)

( * ) Notice: Subject to any disclaimer, the term of this patent is extended or adjusted under 35 U.S.C. 154(b) by 419 days.

(21) Appl. No.: 18/573,403

(22) PCT Filed: Aug. 26, 2022

(86) PCT No.: PCT/CN2022/115086
§ 371 (c)(1),
(2) Date: Dec. 21, 2023

(87) PCT Pub. No.: WO2024/040563
PCT Pub. Date: Feb. 29, 2024

(65) Prior Publication Data
US 2025/0113621 A1 Apr. 3, 2025

(51) Int. Cl.
*H10D 89/60* (2025.01)
*H10D 62/10* (2025.01)
(Continued)

(52) U.S. Cl.
CPC ......... *H10D 89/811* (2025.01); *H10D 62/124* (2025.01); *H10D 62/8503* (2025.01); *H10D 64/518* (2025.01)

(58) Field of Classification Search
CPC ............... H10D 30/475; H10D 62/124; H10D 62/8503; H10D 64/518; H10D 89/60; H10D 89/811
See application file for complete search history.

(56) References Cited

U.S. PATENT DOCUMENTS 9,536,873 B2 1/2017 Kanechika et al.
2016/0035719 A1* 2/2016 Kanechika ........... H10D 30/475 257/195

(Continued)

FOREIGN PATENT DOCUMENTS

CN 105322008 2/2016
WO WO-2021217400 A1 * 11/2021 ............. H02H 9/046

OTHER PUBLICATIONS

"International Search Report (Form PCT/ISA/210) of PCT/CN2022/115086," mailed on May 8, 2023, pp. 1-3.

(Continued)

*Primary Examiner* — Shaun M Campbell
(74) *Attorney, Agent, or Firm* — JCIPRNET

(57) ABSTRACT

Semiconductor device structures and methods for manufacturing the same are provided. The semiconductor device structure includes a substrate, a first nitride semiconductor layer, a second nitride semiconductor layer, a third nitride semiconductor layer, and a fourth nitride semiconductor layer. The substrate has a first region and a second region. The second nitride semiconductor layer is disposed on the first nitride semiconductor layer and has a bandgap greater than that of the first nitride semiconductor layer. The third nitride semiconductor layer is doped with impurity and on the first region. The fourth nitride semiconductor layer is doped with impurity and disposed on the second region. A first width of the third nitride semiconductor layer is different from a second width of the fourth nitride semiconductor layer.

23 Claims, 7 Drawing Sheets

(51) Int. Cl.
*H10D 62/85* (2025.01)
*H10D 64/27* (2025.01)

(56) References Cited

U.S. PATENT DOCUMENTS

| | | | | |
|---|---|---|---|---|
| 2020/0035666 | A1* | 1/2020 | Shibib | H10D 89/60 |
| 2022/0376494 | A1* | 11/2022 | Guan | H10D 89/811 |
| 2023/0006440 | A1* | 1/2023 | Jiang | H10D 89/811 |

OTHER PUBLICATIONS

"Written Opinion of the International Searching Authority (Form PCT/ISA/237) of PCT/CN2022/115086," mailed on May 8, 2023, pp. 1-3.

* cited by examiner

SEMICONDUCTOR DEVICE STRUCTURES AND METHODS OF MANUFACTURING THE SAME

CROSS-REFERENCE TO RELATED APPLICATION

The present application is a U.S. 371 National Stage of International Application No. PCT/CN2022/115086, filed on Aug. 26, 2022, the contents of which are incorporated herein by reference in their entirety for all purposes.

BACKGROUND

1. Field of the Disclosure

The present disclosure relates to a semiconductor device structure and more particularly to a semiconductor device structure including an electrostatic discharge (ESD) protection device.

2. Description of Related Art

Components including direct bandgap semiconductors, such as semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a first nitride semiconductor layer, a second nitride semiconductor layer, a barrier layer, a third nitride semiconductor layer, a fourth nitride semiconductor layer, a first gate structure and a second gate structure. The substrate has a first region and a second region. The first nitride semiconductor layer is disposed on the first region and the second region of the substrate. The second nitride semiconductor layer is disposed on the first nitride semiconductor layer and has a bandgap greater than that of the first nitride semiconductor layer. The third nitride semiconductor layer is doped with impurity and disposed on the second nitride semiconductor layer and on the first region of the substrate. The first gate structure is disposed on the third nitride semiconductor layer. The fourth nitride semiconductor layer is doped with impurity and disposed on the second nitride semiconductor layer and on the second region of the substrate. The second gate structure is disposed on the fourth nitride semiconductor layer. A first width of the third nitride semiconductor layer is different from a second width of the fourth nitride semiconductor layer.

According to some embodiments of the present disclosure, a method of manufacturing a semiconductor device structure includes: providing a substrate, the substrate having a first region and a second region; forming a first nitride semiconductor layer on the first region and the second region of the substrate; forming a second nitride semiconductor layer on the first nitride semiconductor layer, wherein the second nitride semiconductor layer has a bandgap greater than that of the first nitride semiconductor layer; forming a third nitride semiconductor layer on the second nitride semiconductor layer and on the first region of the substrate, wherein the third nitride semiconductor layer is doped with impurity; and forming a fourth nitride semiconductor layer on the second nitride semiconductor layer and on the second region of the substrate, wherein the fourth nitride semiconductor layer is doped with impurity, wherein a first width of the third nitride semiconductor layer is different from a second width of the fourth nitride semiconductor layer.

The present disclosure provides a semiconductor device including an ESD protection device, which is configured to protect a working device from ESD. The ESD device has a relatively small dimensions in comparison with the working device. When a voltage imposed on the semiconductor device exceeds a predetermined value, the signal may pass through the ESD protection device, which thereby prevents the working device from punch-through.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
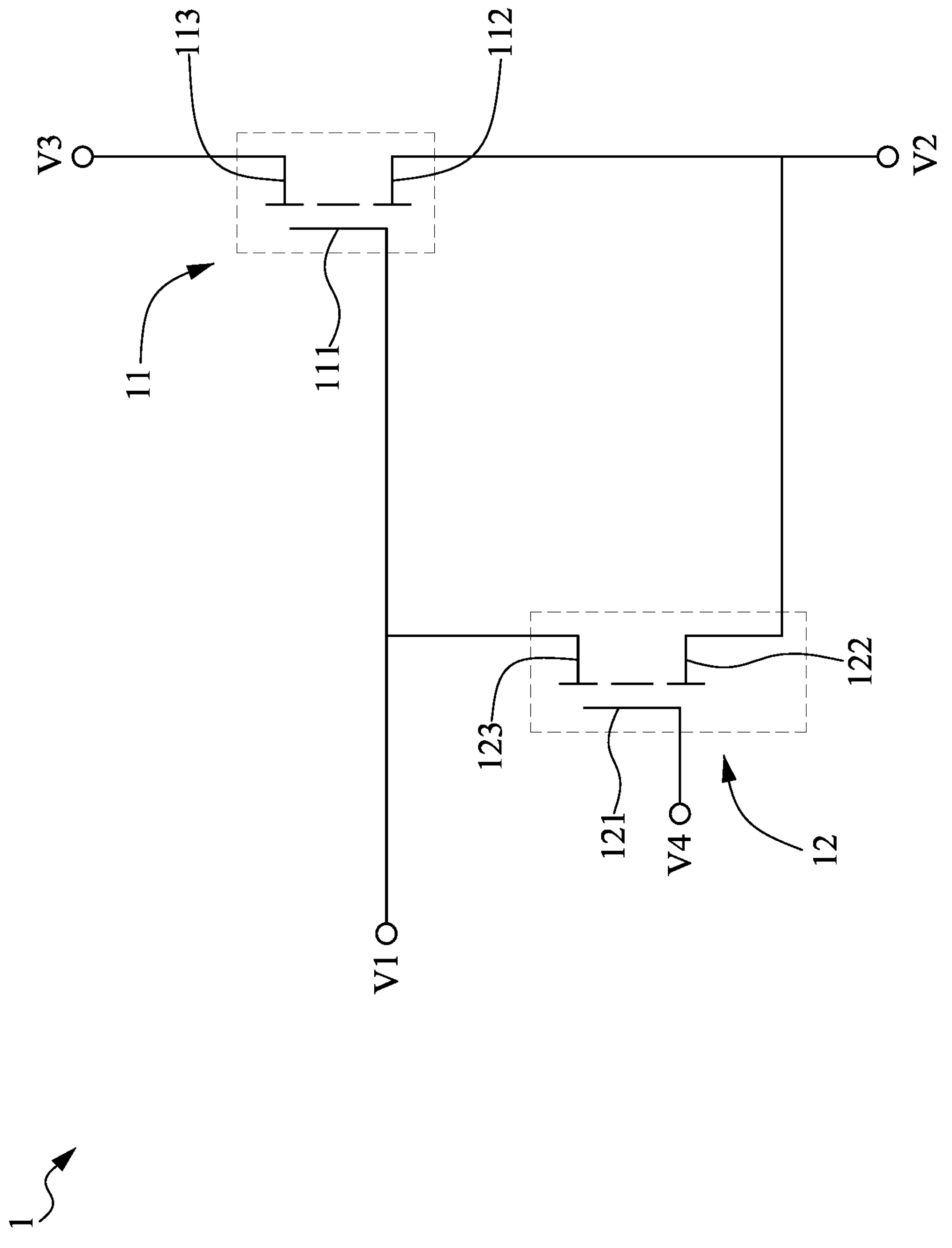
FIG. 1 is a schematic view of a circuit, in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described as follows. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

The present disclosure provides a semiconductor device structure including an ESD protection device. The ESD protection device may have dimensions less than those of a working device, which thereby prevents the working device from punch-through. Both the ESD protection device and the working device may be HEMTs, resulting in a relatively short distance path between the ESD protection device and the working device with resulting improvement in protection.

FIG. 1 is a schematic view of a circuit 1, in accordance with some embodiments of the present disclosure. The circuit 1 of the present disclosure can be applied in, without limitation, HEMT devices, especially in low voltage HEMT devices, high voltage HEMT devices and radio frequency (RF) HEMT devices.

The circuit 1 may include a device 11 and a device 12.

The device 11 may include a working device. The device 11 may be configured to transmit a data signal. The data signal may include an analog signal. The data signal may include a digital signal. The data signal may include a radio frequency (RF) signal. The device 11 may be configured to transmit a power signal. The device 11 may be an HEMT. The device 11 may be an HBT. The device 11 may be an HFET. The device 11 may be a MODFET.

The device 11 may include a terminal 111, a terminal 112, and a terminal 113.

The terminal 111 may correspond to a gate electrode of a semiconductor device structure. The terminal 111 may be electrically coupled to a terminal V1. The terminal 111 may be electrically coupled to a terminal (e.g., terminal 123) of a device 12. The terminal V1 may be coupled to a power source. The terminal V1 may be coupled to an active device. The active device may include a transistor. The active device may include a diode. The terminal V1 may be coupled to a passive device. The passive device may include a capacitor. The passive device may include a resistor. The passive device may include an inductor.

The terminal 112 may correspond to a source electrode of a semiconductor device structure. The terminal 112 may be electrically coupled to a terminal V2. The terminal 112 may be electrically coupled to a terminal (e.g., terminal 122) of a device 12. The terminal V2 may be coupled to an external device. The external device may include an active device. The external device may include a passive device.

The terminal 113 may correspond to a drain electrode of a semiconductor device structure. The terminal 113 may be electrically coupled to a terminal V3. The terminal V3 may be coupled to an external device.

The device 12 may include an electrostatic discharge (ESD) protection device. The device 12 may be electrically coupled to the device 11. The device 12 may be configured to protect the device 11 from electrostatic discharge. The device 12 may be an HEMT. The device 12 may be an HBT. The device 12 may be an HFET. The device 12 may be a MODFET.

The device 12 may include a terminal 121, a terminal 122, and a terminal 123.

The terminal 121 may correspond to a gate electrode of a semiconductor device structure. The terminal 121 may be electrically coupled to a terminal V4. The terminal V4 may be electrically connected to ground. The terminal V4 may be floating.

The terminal 122 may correspond to a source electrode of a semiconductor device structure. The terminal 122 may be electrically coupled to the terminal V2. The terminal 122 may be electrically coupled to the terminal 112 of the device 11.

The terminal 123 may correspond to a drain electrode of a semiconductor device structure. The terminal 123 may be electrically coupled to the terminal V1. The terminal 123 may be coupled to the terminal 111 of the device 11.

Figure 2A:
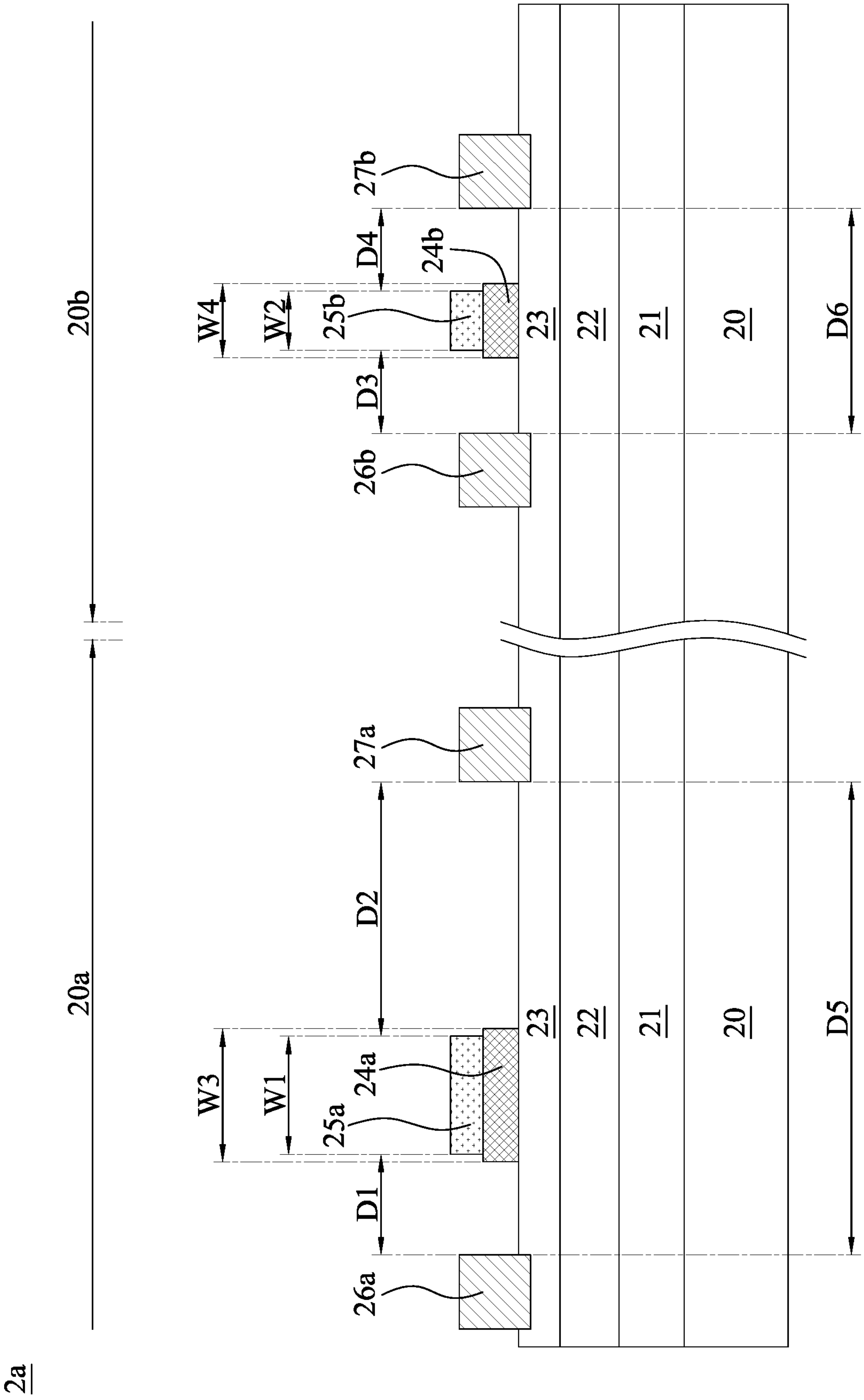
FIG. 2A is a cross-sectional view of a semiconductor device structure in accordance with some embodiments of the present disclosure.

FIG. 2A is a cross-sectional view of a semiconductor device structure 2*a* in accordance with some embodiments of the present disclosure.

The semiconductor device structure 2*a* may include a substrate 20, a buffer layer 21, a nitride semiconductor layer 22, a nitride semiconductor layer 23, a nitride semiconductor layer 24*a*, a nitride semiconductor layer 24*b*, and electrodes 25*a*, 25*b*, 26*a*, 26*b*, 27*a*, and 27*b*.

The substrate 20 may include, without limitation, silicon (Si), doped Si, silicon carbide (SiC), germanium silicide (SiGe), gallium arsenide (GaAs), or other semiconductor materials. The substrate 20 may include, without limitation, sapphire, silicon on insulator (SOI), or other suitable materials. The substrate 20 may include a region 20*a*. The structure as shown in the region 20*a* may correspond to the device 11 of the circuit 1. The structure as shown in the region 20*a* may correspond to the device 11 as shown in FIG. 1. The substrate 20 may include a in region 20*b*. The structure as shown in the region 20*b* may correspond to the device 12 of the circuit 1. The structure as shown in the region 20*b* may correspond to the device 12 as shown in FIG. 1.

The buffer layer 21 may be disposed on the substrate 20. The buffer layer 21 may be configured to reduce defect due to the dislocation between the substrate 20 and the nitride semiconductor layer 22. The buffer layer 21 may include, but is not limited to, nitride, such as AlN, AlGaN or the like.

The nitride semiconductor layer 22 may be disposed on the buffer layer 21. The nitride semiconductor layer 22 may include a group III-V layer. The nitride semiconductor layer 22 may include, but is not limited to, a group III nitride, for example, a compound $In_aAl_bGa_{1-a-b}N$, in which a+b≤1. The group III nitride further includes, but is not limited to, for example, a compound $Al_aGa_{(1-a)}N$, in which a≤1. The nitride semiconductor layer 22 may include a gallium nitride (GaN) layer. GaN has a bandgap of about 3.4 eV. The thickness of the nitride semiconductor layer 22 may range, but is not limited to, from about 0.5 μm to about 10 μm.

The nitride semiconductor layer 23 may be disposed on the nitride semiconductor layer 22. The nitride semiconductor layer 23 may include a group III-V layer. The nitride semiconductor layer 23 may include, but is not limited to, a group III nitride, for example, a compound $In_aAl_bGa_{1-a-b}N$, in which a+b≤1. The group III nitride may further include, but is not limited to, for example, a compound $Al_aGa_{(1-a)}N$, in which a≤1. The nitride semiconductor layer 23 may have a greater bandgap than that of the nitride semiconductor layer 22. The nitride semiconductor layer 23 may include an aluminum gallium nitride (AlGaN) layer. AlGaN has a bandgap of about 4.0 eV. The thickness of the nitride semiconductor layer 23 may range from, but is not limited to, from about 10 nm to about 100 nm.

A heterojunction is formed between the nitride semiconductor layer 23 and the nitride semiconductor layer 22, and the polarization of the heterojunction forms a two-dimensional electron gas (2DEG) in the nitride semiconductor layer 22. The 2DEG may be formed in the nitride semiconductor layer 22 and adjacent to the nitride semiconductor layer 23.

The nitride semiconductor layer 24*a* (or a depletion layer) may be disposed on the nitride semiconductor layer 23. The nitride semiconductor layer 24*a* may be disposed on the region 20*a* of the substrate 20. The nitride semiconductor layer 24*a* may be in direct contact with the nitride semiconductor layer 23. The nitride semiconductor layer 24*a* may be doped with impurities. The nitride semiconductor layer 24*a* may include p-type dopants. It is contemplated that the nitride semiconductor layer 24*a* may include a p-doped GaN layer, p-doped AlGaN layer, p-doped AlN layer or other suitable III-V group layers. The p-type dopants may include magnesium (Mg), beryllium (Be), zinc (Zn) and cadmium (Cd). The nitride semiconductor layer 24*a* may be configured to control the concentration of the 2DEG in the nitride semiconductor layer 22. The nitride semiconductor layer 24*a* can be used to deplete the 2DEG under the nitride semiconductor layer 24*a*.

The nitride semiconductor layer 24*b* (or a depletion layer) may be disposed on the nitride semiconductor layer 23. The nitride semiconductor layer 24*b* may be disposed on the region 20*b* of the substrate 20. The nitride semiconductor layer 24*b* may be in direct contact with the nitride semiconductor layer 23. The nitride semiconductor layer 24*a* and the nitride semiconductor layer 24*b* may be located at the same horizontal elevation. The nitride semiconductor layer 24*b* may be doped with impurities. The nitride semiconductor layer 24*b* may include p-type dopants. It is contemplated that the nitride semiconductor layer 24*b* may include a p-doped GaN layer, p-doped AlGaN layer, p-doped AlN layer or other suitable III-V group layers. The p-type dopants may include magnesium (Mg), beryllium (Be), zinc (Zn) and cadmium (Cd). The nitride semiconductor layer 24*b* may be configured to control the concentration of the 2DEG in the nitride semiconductor layer 22. The nitride semiconductor layer 24*b* can be used to deplete the 2DEG under the nitride semiconductor layer 24*b*.

The electrode 25*a* may be disposed on the nitride semiconductor layer 24*a*. The electrode 25*a* may be disposed on the region 20*a* of the substrate 20. The electrode 25*a* may include a gate structure. The electrode 25*a* may include a gate conductive structure. The gate conductive structure may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials. The electrode 25*a* may correspond to the terminal 111 of the device 11. The electrode 25*a* may correspond to the terminal 111 as shown in FIG. 1.

The electrode 25*b* may be disposed on the nitride semiconductor layer 24*b*. The electrode 25*b* may include a gate structure. The electrode 25*b* may be disposed on the region 20*b* of the substrate 20. The electrode 25*a* and the electrode 25*b* may be located at the same horizontal elevation. The electrode 25*b* may include a gate conductive structure. The electrode 25*b* may correspond to the terminal 121 of the device 12. The electrode 25*b* may correspond to the terminal 121 as shown in FIG. 1.

The electrode 26*a* (or a source electrode or a source structure) may be disposed on the nitride semiconductor layer 23. The electrode 26*a* may be disposed on the region 20*a* of the substrate 20. The electrode 26*a* may be in contact with the nitride semiconductor layer 23. The electrode 26*a* may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN or other suitable materials. The electrode 26*a* may correspond to the terminal 112 of the device 11. The electrode 26*a* may correspond to the terminal 112 as shown in FIG. 1.

The electrode 26*b* (or a source electrode or a source structure) may be disposed on the nitride semiconductor layer 23. The electrode 26*b* may be disposed on the region 20*b* of the substrate 20. The electrode 26*b* may be in contact with the nitride semiconductor layer 23. The electrode 26*b* may include, for example, without limitation, a conductive material. The electrode 26*a* and the electrode 26*b* may be located at the same horizontal elevation. The electrode 26*b* may correspond to the terminal 122 of the device 12. The electrode 26*b* may correspond to the terminal 122 as shown in FIG. 1.

The electrode 27*a* (or a drain electrode or a drain structure) may be disposed on the nitride semiconductor layer 23. The electrode 27*a* may be disposed on the region 20*a* of the substrate 20. The electrode 27*a* may be in contact with the nitride semiconductor layer 23. The electrode 27*a* may include, for example, without limitation, a conductive material. The electrode 27*a* may correspond to the terminal 113 of the device 11. The electrode 27*a* may correspond to the terminal 113 as shown in FIG. 1.

The electrode 27*b* (or a drain electrode or a drain structure) may be disposed on the nitride semiconductor layer 23. The electrode 27*b* may be disposed on the region 20*b* of the substrate 20. The electrode 27*b* may be in contact with the nitride semiconductor layer 23. The electrode 27*b* may include, for example, without limitation, a conductive material. The electrode 27*a* and the electrode 27*b* may be located at the same horizontal elevation. The electrode 27*b* may correspond to the terminal 123 of the device 12. The electrode 27*b* may correspond to the terminal 123 as shown in FIG. 1.

The electrode 26*a* and the electrode 27*a* may be disposed on two opposite sides of the electrode 25*a*. The electrode 25*a* may be disposed between the electrode 26*a* and the electrode 27*a*. Although the electrode 26*a* and the electrode 27*a* are disposed on two opposite sides of the electrode 25*a* in FIG. 2A, the electrode 25*a*, the electrode 26*a*, and the electrode 27*a* may have different configurations in other embodiments of the present disclosure due to design requirements.

Although it is not illustrated in FIG. 2A, it is contemplated that structure of the electrode 26*a* can be varied or changed in some other embodiments of the subject application. Although it is not illustrated in FIG. 2A, it is contemplated that structure of the electrode 26*b* can be varied or changed in some other embodiments of the subject application. Although it is not illustrated in FIG. 2A, it is contemplated that structure of the electrode 27*a* can be varied or changed in some other embodiments of the subject application. Although it is not illustrated in FIG. 2A, it is contemplated that structure of the electrode 27*b* can be varied or changed in some other embodiments of the subject application. For example, a portion of the electrode 26*a* may be located or extended in the nitride semiconductor layer 22. A portion of the electrode 26*b* may be located or extended in the nitride semiconductor layer 22. A portion of the electrode 27*a* may be located or extended in the nitride semiconductor layer 22. A portion of the electrode 27*b* may be located or extended in the nitride semiconductor layer 22. The electrode 26*a* may be disposed on the nitride semiconductor layer 22. The electrode 26*b* may be disposed on the nitride semiconductor layer 22. The electrode 27*a* may be disposed on the nitride semiconductor layer 22. The electrode 27*b* may be disposed on the nitride semiconductor layer 22. The electrode 26*a* may penetrate the nitride semiconductor layer 23 to contact the nitride semiconductor layer 22. The electrode 26*b* may penetrate the nitride semiconductor layer 23 to contact the nitride semiconductor layer 22. The electrode 27*a* may penetrate the nitride semiconductor layer 23 to contact the nitride semiconductor layer 22. The electrode 27*b* may penetrate the nitride semiconductor layer 23 to contact the nitride semiconductor layer 22.

The device 11 may have a dimension different from that of the device 12. The device 11 may have a dimension (e.g., a width, a length, or a surface area) greater than that of the device 12. For example, the terminal 111 of the device 11 may have a dimension greater than that of the terminal 121 of the device 12. As shown in FIG. 2A, the electrode 25*a* may have a dimension W1. The electrode 25*b* may have a dimension W2. The dimension W1 may be greater than the dimension W2. The ratio between the dimension W1 and the dimension W2 may range from about 2 to about 10, such as 2, 3, 4, 5, 6, 7, 8, 9, or 10. As used herein, the dimension may refer to a width, a length, a surface area, or a volume.

The nitride semiconductor layer 24*a* may have a dimension W3. The nitride semiconductor layer 24*b* may have a dimension W4. The dimension W3 may be greater than the dimension W4. The ratio between the dimension W3 and the dimension W4 may range from about 2 to about 10, such as 2, 3, 4, 5, 6, 7, 8, 9, or 10. A punch-through voltage of a device (e.g., 11) may depend on the dimension W3 of the nitride semiconductor layer 24*a*. A punch-through voltage of a device (e.g., 12) may depend on the dimension W4 of the nitride semiconductor layer 24*b*. The punch-through voltage of the device 11 may be different from the punch-through voltage of the device 12. The punch-through voltage of the device 11 may exceed the punch-through voltage of the device 12.

The electrode 26*a* and the nitride semiconductor layer 24*a* may have a distance D1. The electrode 27*a* and the nitride semiconductor layer 24*a* may have a distance D2. The electrode 26*b* and the nitride semiconductor layer 24*b* may have a distance D3. The electrode 27*b* and the nitride semiconductor layer 24*b* may have a distance D4.

In some situations, the nitride semiconductor layer 24*a*, electrodes 25*a*, 26*a*, and 27*a* may be applied in a high voltage device. The distance D1 may be different from the distance D2. The distance D1 may be less than the distance D2. The ratio between the distance D2 and the distance D1 may range from about 5 to about 15, such as 5, 6, 7, 8, 9, 10, 11, 12, 13, 14, or 15.

The distance D1 may be greater than the distance D3. The ratio between the distance D1 and the distance D3 may range from about 1.1 to about 5, such as 1.1, 2, 3, 4, or 5. The distance D1 may substantially equal the distance D3.

The distance D2 may be greater than the distance D4.

In some situations, the nitride semiconductor layer 24*b*, electrodes 25*b*, 26*b*, and 27*b* may be configured to serve as an ESD protection device. The distance D3 may substantially equal the distance D4.

The electrode 26*a* and the electrode 27*a* may have a distance D5 therebetween. The electrode 26*b* and the electrode 27*b* may have a distance D6 therebetween. The distance D5 may be greater than the distance D6. The ratio between the distance D5 and the distance D6 may range from about 5 to about 10, such as 5, 6, 7, 8, 9, or 10.

Since the device 12 has dimensions less than those of the device 11. The device 12 may have a smaller punch-through voltage. When a voltage imposed on the device 11 exceeds a predetermined value, the signal may pass through the device 12. In this situation, the signal path may not pass through the device 11. Therefore, the device 12 may serve as an ESD protection device. Both the device 11 and the device 12 may be integrated into a semiconductor device structure including GaN/AlGaN, which thereby enhances the performance of the ESD protection device. In a comparative example, a working device is an HEMT, and an ESD protection device is an external device coupled to the working device through a circuit board, resulting in a relatively long transmission path. The relatively long transmission path may adversely affect the performance of the ESD protection device, which thereby degrades the performance of the semiconductor device structure. When the ratio of the dimensions between the device 11 and the device 12 is located in the noted range, electrical properties of the semiconductor device structure 1*a* may be optimized.

Figure 2B:
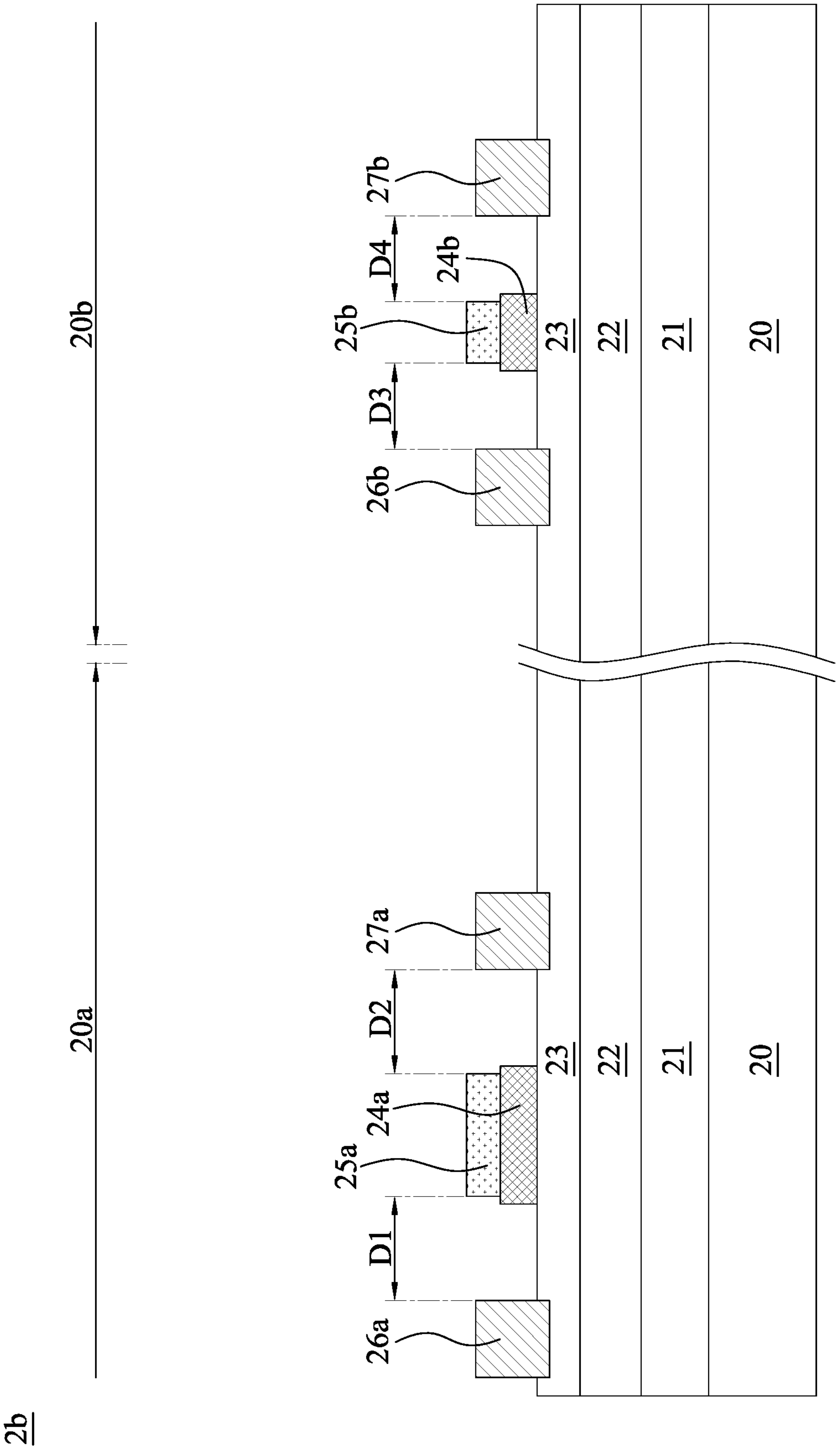
FIG. 2B is a cross-sectional view of a semiconductor device structure in accordance with some embodiments of the present disclosure.

FIG. 2B is a cross-sectional view of a semiconductor device structure 2*b* in accordance with some embodiments of the present disclosure. The semiconductor device structure 2*b* may have a structure similar to the semiconductor device structure 2*a* except that the distance D2 may be substantially the same as the distance D1. The distance D1 between the electrode 25*a* and the electrode 26*a* may be equal to the distance D2 between the electrode 25*a* and the electrode 27*a*.

Figure 2C:
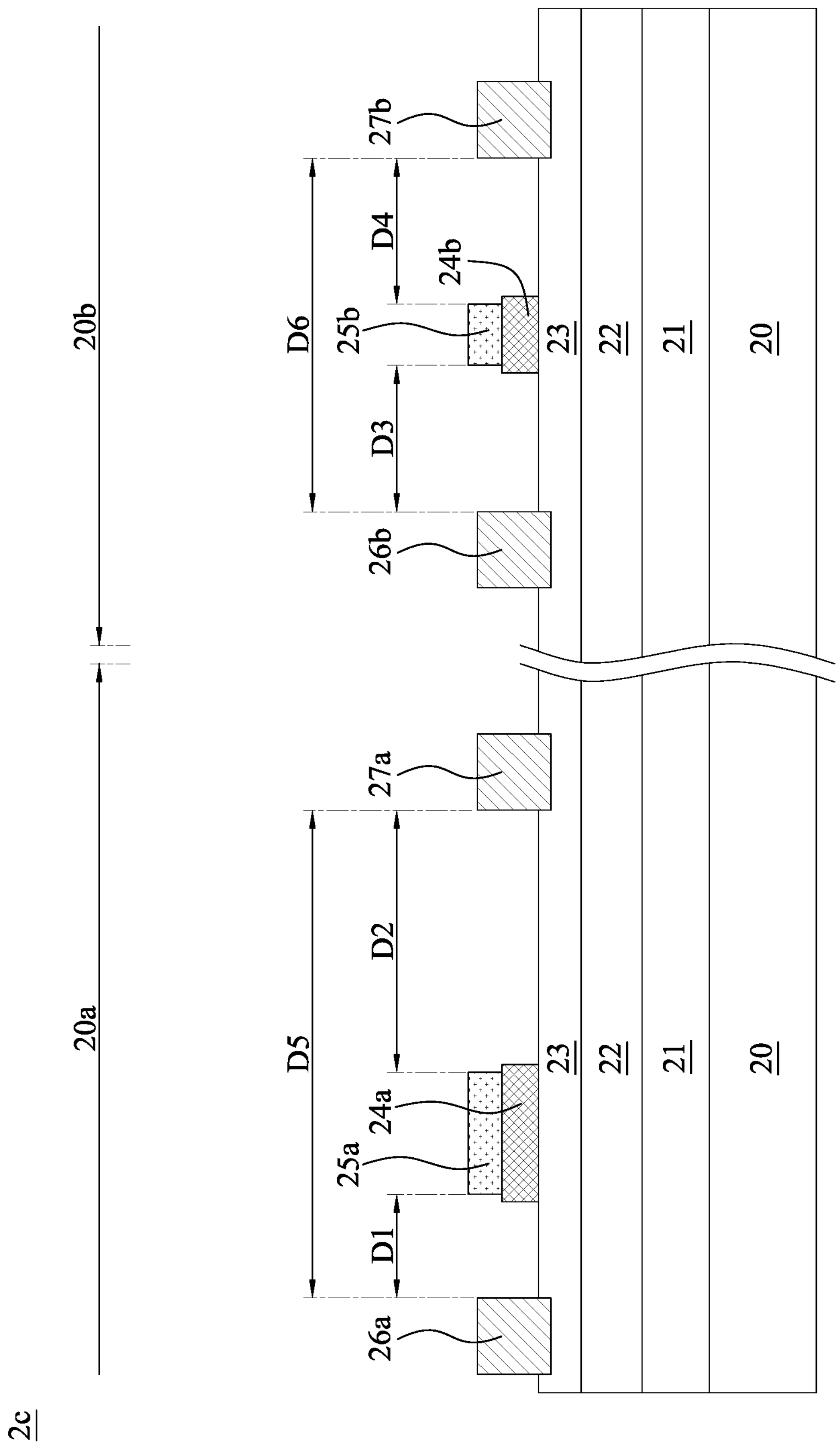
FIG. 2C is a cross-sectional view of a semiconductor device structure in accordance with some embodiments of the present disclosure.

FIG. 2C is a cross-sectional view of a semiconductor device structure 2*c* in accordance with some embodiments of the present disclosure. The semiconductor device structure 2*c* may have a structure similar to the semiconductor device structure 2*a* except that the distance D3 may be greater than the distance D1. The distance D3 may be less than the distance D2. The distance D3 may be substantially the same as the distance D4. The distance D3 between the electrode 25*b* and the electrode 26*b* may be equal to the distance D4 between the electrode 25*b* and the electrode 27*b*. The distance D4 may be greater than the distance D1. The distance D5 may be greater than the distance D6.

Figure 2D:
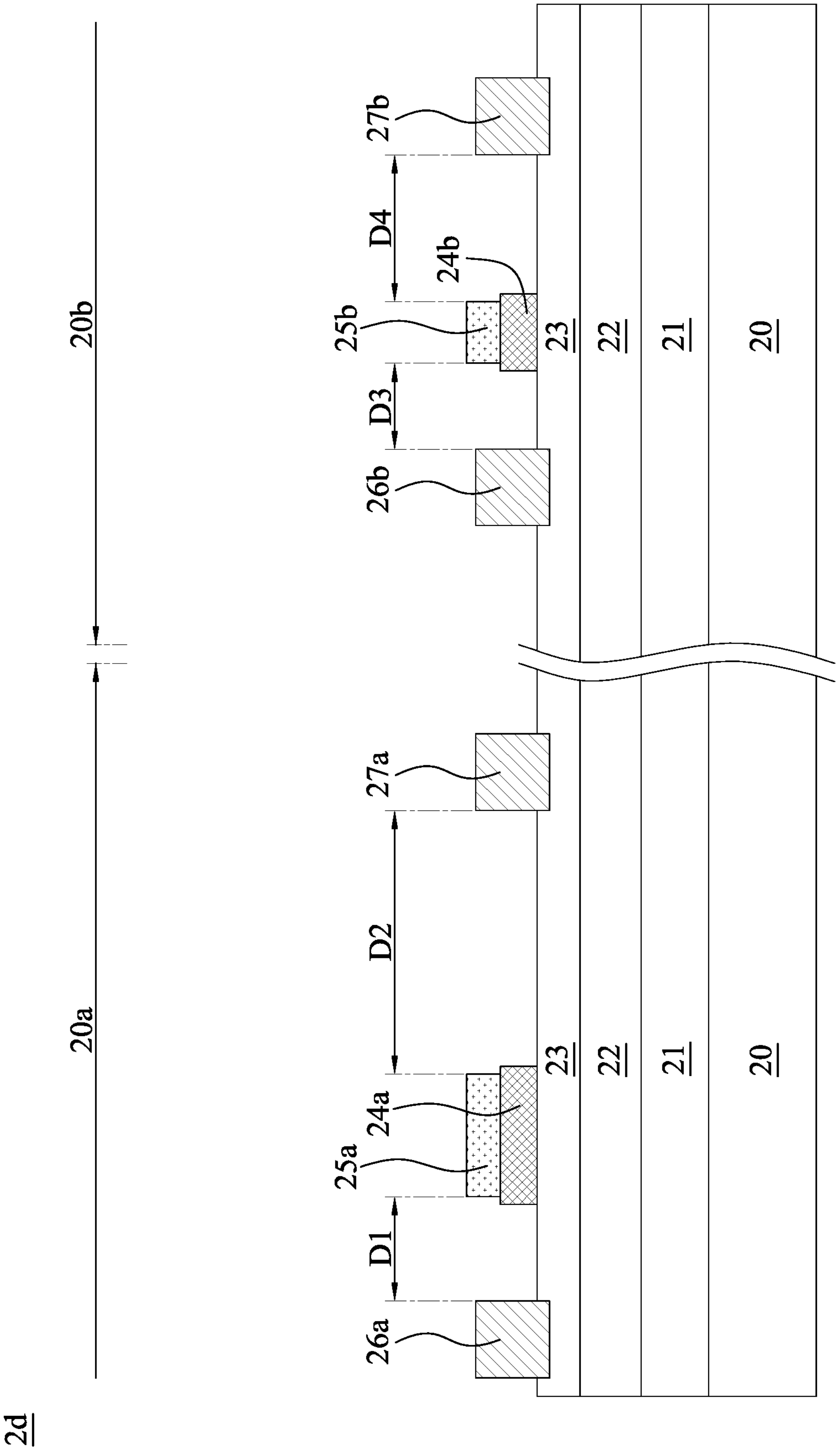
FIG. 2D is a cross-sectional view of a semiconductor device structure in accordance with some embodiments of the present disclosure.

FIG. 2D is a cross-sectional view of a semiconductor device structure 2*d* in accordance with some embodiments of the present disclosure. The semiconductor device structure 2*d* may have a structure similar to the semiconductor device structure 2*a* except that the distance D3 may be less than the distance D4. The distance D4 between the electrode 25*b* and the electrode 27*b* may be greater than the distance D3 between the electrode 25*b* and the electrode 26*b*. The distance D4 may be greater than the distance D1. The distance D4 may be less than the distance D2.

Figure 3:
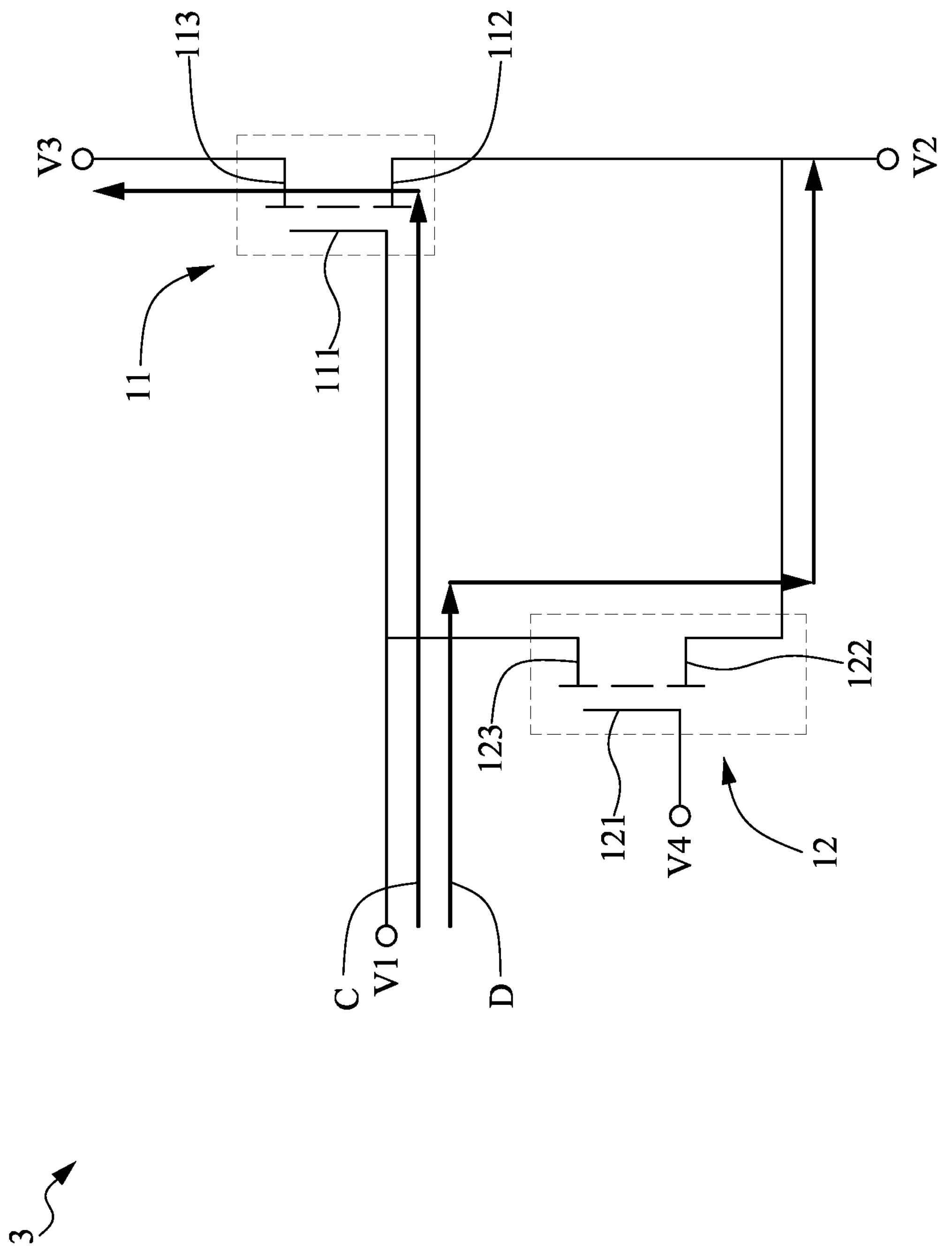
FIG. 3 illustrates signal paths of a circuit, in accordance with some embodiments of the present disclosure.

FIG. 3 is a schematic view of a circuit 3 and signal paths therein, in accordance with some embodiments of the present disclosure. The circuit 3 may be the same as or similar to the circuit 1.

The circuit 3 may provide a signal path C. The signal path C may pass from terminal V1 to the terminal V3. The signal path C may pass through the device 11. The signal path C may pass through the terminal 111 of the device 11. The signal path C may pass through the terminal 113 of the device 11.

The circuit 3 may provide a signal path D. The signal path D may pass from terminal V1 to the terminal V2. The signal path D may pass through the device 12. The signal path D may pass through the terminal 123 of the device 12. The signal path D may pass through the terminal 122 of the device 12. The signal path D may not pass through the device 11.

When a voltage imposed on the device 11 is lower than a predetermined value, the circuit 3 may provide the signal path C. The signal path C may not pass through the device 12. The signal path C may facilitate the operation of the device 11.

When a voltage imposed on the device 11 exceeds a predetermined value, the circuit 3 may provide the signal path D, which may prevent the device 11 from punch-through.

Figure 4:
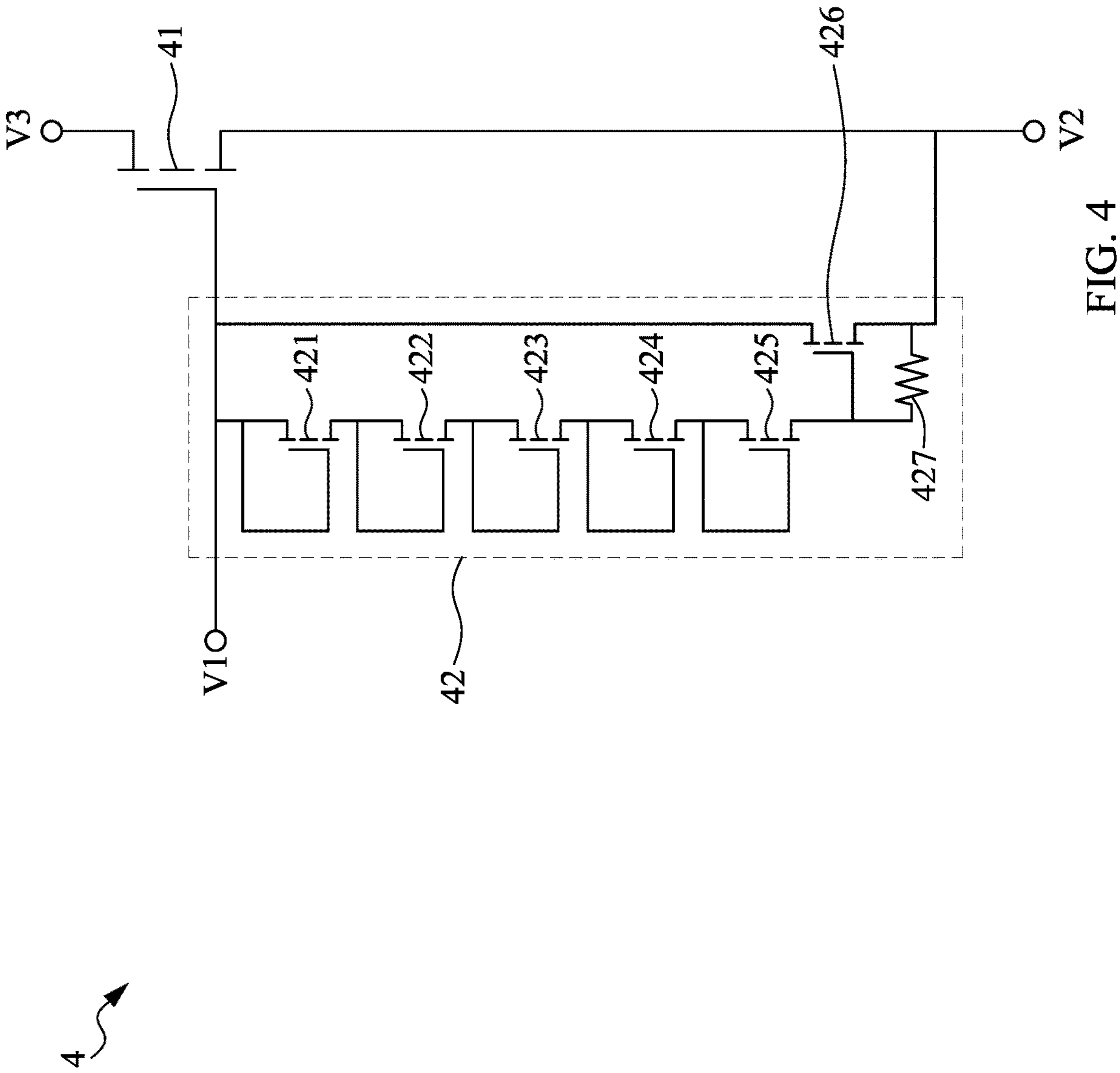
FIG. 4 is a schematic view of a circuit, in accordance with some embodiments of the present disclosure.

FIG. 4 is a schematic view of a circuit 4, in accordance with some embodiments of the present disclosure.

The circuit 4 may include a device 41 and a device 42. The device 41 may serve as a working device. The device 42 may serve as an ESD protection device. The device 42 may include two or more HEMTs. The device 42 may include HEMTs 421, 422, 423, 424, 425, and 426. The HEMTs 421, 422, 423, 424, and 425 may be electrically connected in series. The HEMT 426 may be electrically connected to the HEMTs 421, 422, 423, 424, and 425 in parallel. The device 42 may include a resistor 427. The resistor 427 may be electrically connected to a drain terminal (or a source terminal) of the HEMT 425. The resistor 427 may be electrically connected to a drain terminal (or a source terminal) of the HEMT 426. The device 42 may be configured to protect the device 41 from electrostatic discharge. Each of the HEMTs 421, 422, 423, 424, 425, and 426 may have dimensions substantially equal to those of the device 41. The device 42 may have a relatively large size in comparison with the device 12.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:

a substrate having a first region and a second region;

a first nitride semiconductor layer disposed on the first region and the second region of the substrate;

a second nitride semiconductor layer disposed on the first nitride semiconductor layer and having a bandgap greater than that of the first nitride semiconductor layer;

a third nitride semiconductor layer doped with impurity and disposed on the second nitride semiconductor layer and on the first region of the substrate;

a first gate structure disposed on the third nitride semiconductor layer;

a fourth nitride semiconductor layer doped with impurity and disposed on the second nitride semiconductor layer and on the second region of the substrate; and a second gate structure disposed on the fourth nitride semiconductor layer, wherein a first width of the third nitride semiconductor layer is different from a second width of the fourth nitride semiconductor layer;

wherein the first nitride semiconductor layer, the second nitride semiconductor layer, the third nitride semiconductor layer, and the first gate structure are included in a working device, the first nitride semiconductor layer, the second nitride semiconductor layer, the fourth nitride semiconductor layer, and the second gate structure are included in an electrostatic discharge (ESD) protective device, and wherein the ESD protective device is electrically coupled to the working device;

wherein the working device further includes a first terminal and a second terminal;

wherein the ESD protective device further includes a third terminal and a fourth terminal, a fifth distance between the first terminal and the second terminal is greater than a sixth distance between the third terminal and the fourth terminal.

2. The semiconductor device structure of claim 1, wherein the first width is greater than the second width.

3. The semiconductor device structure of claim 1, wherein a first distance between the first gate structure and the first terminal is different from a second distance between the first gate structure and the second terminal.

4. The semiconductor device structure of claim 3, wherein a third distance between the second gate structure and the third terminal is substantially equal to a fourth distance between the second gate structure and the fourth terminal.

5. The semiconductor device structure of claim 4, wherein the third distance is less than the first distance and the second distance.

6. The semiconductor device structure of claim 1, wherein the third terminal of the ESD protective device is electrically coupled to the first gate structure of the working device.

7. The semiconductor device structure of claim 1, wherein the fourth terminal of the ESD protective device is electrically coupled to the first terminal of the working device.

8. The semiconductor device structure of claim 3, wherein the first distance is less than the second distance.

9. The semiconductor device structure of claim 1, wherein a third distance between the second gate structure and the third terminal is different from a fourth distance between the second gate structure and the fourth terminal.

10. The semiconductor device structure of claim 1, wherein a third width of the first gate structure is different from a fourth width of the second gate structure.

11. A method of manufacturing a semiconductor device structure, comprising:

providing a substrate, the substrate having a first region and a second region;

forming a first nitride semiconductor layer on the first region and the second region of the substrate;

forming a second nitride semiconductor layer on the first nitride semiconductor layer, wherein the second nitride semiconductor layer has a bandgap greater than that of the first nitride semiconductor layer;

forming a third nitride semiconductor layer on the second nitride semiconductor layer and on the first region of the substrate, wherein the third nitride semiconductor layer is doped with impurity;

forming a fourth nitride semiconductor layer on the second nitride semiconductor layer and on the second region of the substrate, wherein the fourth nitride semiconductor layer is doped with impurity;

forming a first gate structure on the third nitride semiconductor layer; and forming a second gate structure on the fourth nitride semiconductor layer, wherein a first width of the third nitride semiconductor layer is different from a second width of the fourth nitride semiconductor layer;

wherein the first nitride semiconductor layer, the second nitride semiconductor layer, the third nitride semiconductor layer, and the first gate structure are included in a working device, the first nitride semiconductor layer, the second nitride semiconductor layer, the fourth nitride semiconductor layer, and the second gate structure are included in an electrostatic discharge (ESD) protective device, and wherein the ESD protective device is electrically coupled to the working device;

wherein the method further comprising:

forming a first terminal and a second terminal of the working device; and forming a third terminal and a fourth terminal of the ESD protective device, wherein a fifth distance between the first terminal and the second terminal is greater than a sixth distance between the third terminal and the fourth terminal.

12. The method of claim 11, wherein a third width of the first gate structure is different from a fourth width of the second gate structure.

13. The method of claim 11, wherein a first distance between the first gate structure and the first terminal is different from a second distance between the first gate structure and the second terminal.

14. The method of claim 11, wherein a first distance between the first gate structure and the first terminal is substantially equal to a second distance between the first gate structure and the second terminal.

15. The method of claim 11, wherein a third distance between the second gate structure and the third terminal is substantially equal to a fourth distance between the second gate structure and the fourth terminal.

16. The method of claim 11, wherein a third distance between the second gate structure and the third terminal is different from a fourth distance between the second gate structure and the fourth terminal.

17. A semiconductor device structure, comprising:

a working device;

an electrostatic discharge (ESD) protective device electrically coupled to the working device and configured to protect the working device from electrostatic discharge, wherein the ESD protective device comprises:

a substrate;

a first nitride semiconductor layer disposed on the substrate;

a second nitride semiconductor layer disposed on the first nitride semiconductor layer and having a bandgap greater than that of the first nitride semiconductor layer;

a third nitride semiconductor layer doped with impurity and disposed on the second nitride semiconductor layer;

a first gate structure disposed on the third nitride semiconductor layer;

wherein the working device comprises a fourth nitride semiconductor layer doped with impurity and disposed on the second nitride semiconductor layer and a second gate structure on the fourth nitride semiconductor layer;

wherein a first width of the third nitride semiconductor layer is different from a second width of the fourth nitride semiconductor layer;

wherein the working device includes a third terminal and a fourth terminal;

wherein the ESD protective device further includes a first terminal and a second terminal, a fifth distance between the third terminal and the fourth terminal is greater than a sixth distance between the first terminal and the second terminal.

18. The semiconductor device structure of claim 17, wherein the first width of the third nitride semiconductor layer is less than the second width of the fourth nitride semiconductor layer.

19. The semiconductor device structure of claim 17, wherein a third width of the first gate structure is less than a fourth width of the second gate structure.

20. The semiconductor device structure of claim 17, wherein the first terminal is electrically coupled to the second gate structure of the working device.

21. The semiconductor device structure of claim 20, wherein the second terminal is electrically coupled to the third terminal of the working device.

22. The semiconductor device structure of claim 21, wherein a first distance between the first gate structure and the first terminal is substantially equal to a second distance between the first gate structure and the second terminal.

23. The semiconductor device structure of claim 21, wherein a third distance between the second gate structure and the third terminal is less than a fourth distance between the second gate structure and the fourth terminal.

* * * * *